(12) United States Patent
Seo

(10) Patent No.: US 7,294,555 B2
(45) Date of Patent: Nov. 13, 2007

(54) METHOD OF FORMING TRENCH IN SEMICONDUCTOR DEVICE USING POLISH STOP LAYER AND ANTI-REFLECTION COATING

(75) Inventor: Young-Hun Seo, Bucheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 10/722,295

(22) Filed: Nov. 25, 2003

(65) Prior Publication Data

US 2004/0121552 A1    Jun. 24, 2004

(30) Foreign Application Priority Data

Dec. 20, 2002    (KR)    ............ 10-2002-0081990

(51) Int. Cl.
*H01L 21/76*    (2006.01)
(52) U.S. Cl. .................................. 438/424; 438/435
(58) Field of Classification Search ............ 438/424, 438/427, 435, 700
See application file for complete search history.

(56) References Cited

U.S. PATENT DOCUMENTS

| | | | |
|---|---|---|---|
| 4,528,047 A | 7/1985 | Beyer et al. | |
| 4,680,614 A | 7/1987 | Beyer et al. | |
| 5,801,083 A | 9/1998 | Yu et al. | |
| 6,180,490 B1 | 1/2001 | Vassiliev et al. | |
| 6,524,931 B1 | 2/2003 | Perera | |
| 6,544,871 B1 | 4/2003 | Honeycutt | |
| 6,884,725 B2 * | 4/2005 | Moore et al. | 438/692 |
| 6,884,733 B1 * | 4/2005 | Dakshina-Murthy et al. | 438/717 |
| 6,890,859 B1 * | 5/2005 | Bamnolker et al. | 438/700 |

* cited by examiner

*Primary Examiner*—Jack Chen
(74) *Attorney, Agent, or Firm*—Andrew D. Fortney

(57) ABSTRACT

A method of forming a trench in a semiconductor device includes forming a polish stop layer on a semiconductor substrate. The polish stop layer and the semiconductor substrate are then etched to form a trench. The semiconductor substrate is etched to a predetermined depth. Also, etching is performed such that ends of the polish stop layer adjacent to the trench are rounded. Next, an insulation layer that fills the trench is formed.

22 Claims, 4 Drawing Sheets

(BACKGROUND)

METHOD OF FORMING TRENCH IN SEMICONDUCTOR DEVICE USING POLISH STOP LAYER AND ANTI-REFLECTION COATING

BACKGROUND OF THE INVENTION (a) Field of the Invention

The present invention relates to a method for manufacturing a semiconductor device, and more particularly, to a method for filling an insulation layer in a narrow trench of a small device while avoiding the formation of a void.

(b) Description of the Related Art

Shallow trench isolation (STI) is frequently used as an isolation structure in a semiconductor device. In STI, a trench is formed in a semiconductor substrate, and an insulation material is filled in the trench. Since the formation is limited to the size of the trench, which has as its object size a field region size, this configuration works favorably toward making the semiconductor device small.

It is important in STI to completely fill the trench with the insulation material without the formation of voids. U.S. Pat. Nos. 6,544,871, 4,528,047, 4,680,614, 6,180,490, 5,801,083, 6,524,931 are conventional techniques related to STI.

FIG. 1 shows a sectional view of a conventional STI structure. To form the conventional STI structure, a pad oxidation layer 2 is formed on a semiconductor substrate 1 to a thickness of approximately 200 Å. A silicon nitride layer 3 is then deposited on the pad oxidation layer 2, after which a photoresist layer is deposited on the silicon nitride layer 3. Next, the photoresist layer is exposed and developed such that an area thereof corresponding to where a trench is to be formed is removed. This results in the formation of a photoresist pattern (not shown).

Subsequently, using the photoresist pattern as a mask, the exposed portion of the silicon nitride layer 3, then the pad oxidation layer 2 and a predetermined section of the semiconductor substrate 1 (i.e., a section corresponding to a predetermined depth) under the removed section of the pad oxidation layer 2, are dry-etched. A trench 100 is therefore formed in the semiconductor substrate 1. The photoresist pattern is removed after the formation of the trench 100, then a cleaning process is performed.

Subsequently, a liner oxidation layer 4 is formed over all exposed elements of the silicon nitride layer 3 and inner walls of the trench 100, after which a trench oxidation layer 5 is thickly deposited on the liner oxidation layer 4 until at least the trench 100 is completely filled.

The liner oxidation layer 4 minimizes the stress transferred to the trench region during deposition of the trench oxidation layer 5. The liner oxidation layer 4 also prevents the uneven formation of the trench oxidation layer 5 caused by differences in deposition speeds of the semiconductor substrate 1 and the silicon nitride layer 3. That is, the difference in the materials of the semiconductor substrate 1 and the silicon nitride layer 3 is such that their deposition speeds differ. In addition, with the formation of the liner oxidation layer 4, upper corner areas of the semiconductor substrate 1 adjacent to the trench 100 are rounded (i.e., prevented from being sharply pointed) following a subsequent trench isolation process.

Next, chemical-mechanical polishing is performed on the trench oxidation layer 5 and the liner oxidation layer 4 until the silicon nitride layer 3 is exposed, that is, until the trench oxidation layer 5 and the liner oxidation layer 4 are flattened and flush with the silicon nitride layer 3. This completes the trench isolation process.

However, if an aspect ratio of the trench is increased by a reduction in trench width and an increase in trench depth in an attempt to increase the degree of integration of the device, there is a greater possibility of a void 6 being formed in the trench 100. That is, an entrance of the trench 100 may be partially blocked before a deep area thereof is filled during deposition of the trench oxidation layer 5. The formation of a void 6, therefore, prevents the trench 100 from being completely filled.

Using present trench filling techniques, the formation of voids may be avoided with trenches of a width of 0.24 μm or greater. However, any reduction in the width to, for example, 0.21 μm or 0.18 μm results in the formation of voids.

The formation of a void 6 in the trench oxidation layer 5 as described above may result in the void 6 being exposed following chemical-mechanical polishing to flatten the trench oxidation layer 5. If this occurs, polysilicon deposited to form an electrode in a subsequent process enters the void 6 such that leakage current develops. This results in severe malfunctioning of the device.

SUMMARY OF THE INVENTION

In one exemplary embodiment of the present invention, there is provided a method for forming a trench oxidation layer to completely fill a trench while avoiding the formation of a void.

In an exemplary embodiment of the present invention, a method of forming a trench in a semiconductor device includes forming a polish stop layer on a semiconductor substrate. The polish stop layer and the semiconductor substrate are then etched to form a trench. The semiconductor substrate is etched to a predetermined depth. Also, etching is performed such that ends of the polish stop layer adjacent to the trench are rounded. Next, an insulation layer that fills the trench is formed.

Etching is performed such that following the injection of $CHF_3$, $CF_4$, $O_2$, $HeO_2$, or Ar, plasma is created and dry etching is performed. That is, at most 60 sccm of $CHF_3$ gas, at most 60 sccm of $CF_4$ gas, at most 30 sccm of $O_2$ gas, at most 60 sccm of $HeO_2$ gas, or at most 200 sccm of Ar gas is injected. 50-500 W of power is applied to generate plasma-in a state where $CHF_3$, $CF_4$, $O_2$, $HeO_2$, or Ar is injected. Further, a pressure environment of 5-100 mTorr is created for use during etching.

After forming a polish stop layer on a semiconductor substrate, an anti-reflection coating is formed on to polish stop layer, and the and-reflection coating is selectively etched to form an anti-reflection coating pattern. An area of the polish stop layer exposed through the anti-reflection coating pattern and the semiconductor substrate to a predetermined depth are etched to form the trench, and ends of the anti-reflection coating pattern and ends of the polish stop layer under the ends of the anti-reflection coating pattern are etched such that the ends of the anti-reflection coating are formed into a rounded configuration (see anti-reflection coating 14 in FIG. 2E).

The polish stop layer is deposited to a thickness of 1000-3000 Å. Further, the polish stop layer is made of a material that is more slowly polished than insulation material of the insulation layer. As an example, the polish stop layer is formed of a silicon nitride layer deposited to a thickness of 1000-3000 Å.

During forming an insulation layer that fills the trench, following the formation of the insulation layer to cover the polish stop layer and inner walls of the trench, chemical-mechanical polishing is performed on the insulation layer until the polish stop layer is exposed.

In addition, prior to forming the insulation layer, a liner oxidation layer is formed on the polish stop layer and the trench, then the insulation layer is formed on the liner oxidation layer such that the trench is filled with a material forming the insulation layer.

BRIEF DESCRIPTION OF THE DRAWINGS

The accompanying drawings, which together with the specification, illustrate an exemplary embodiment of the present invention, and, together with the description, serve to explain the principles of the present invention.

DETAILED DESCRIPTION

An exemplary embodiment of the present invention will now be described in detail with-reference to the accompanying drawings.

FIGS. 2A through 2E are sectional views used to describe a method for forming a trench in a semiconductor device according to an exemplary embodiment of the present invention.

Figure 1:
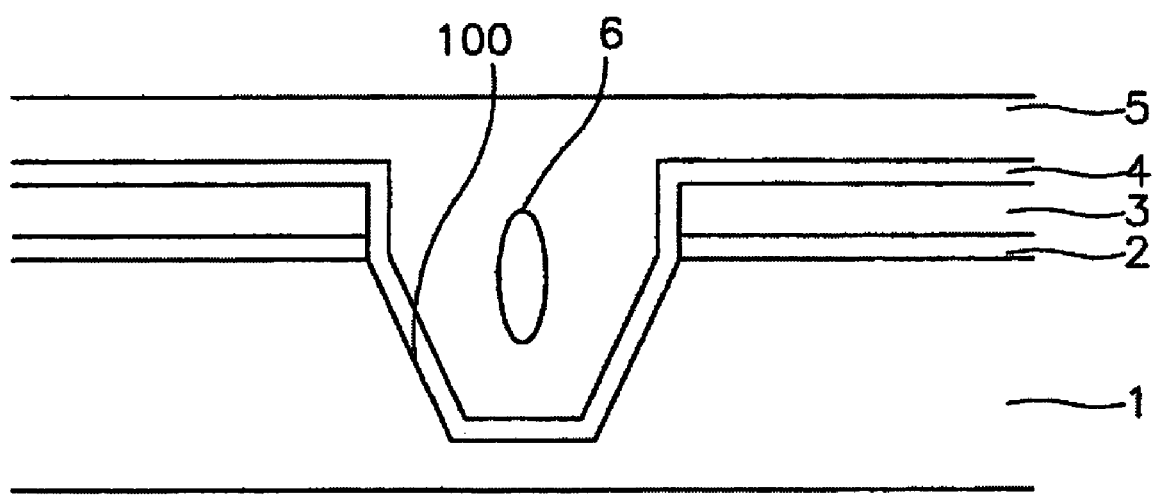
FIG. 1 is a sectional view of a conventional shallow trench isolation structure.
Figure 2A:
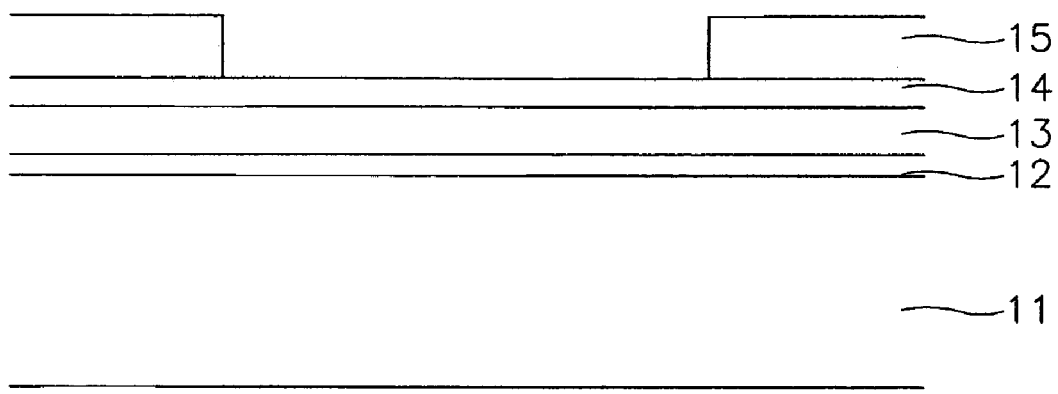
FIGS. 2A through 2E are sectional views used to describe a method for forming a trench in a semiconductor device according to an exemplary embodiment of the present invention.

With reference first to FIG. 2a, a pad oxidation layer 12 is thinly deposited on a semiconductor substrate 11. Next, a silicon nitride layer 13 is deposited on the pad oxidation layer 12, then an anti-reflection coating (ARC) 14 is deposited on the silicon nitride layer 13.

The pad oxidation layer 12 is selectively deposited to minimize stress of the silicon nitride layer 13 from being transmitted to the semiconductor substrate 11. Preferably, the pad oxidation layer 12 is deposited thinly at a thickness of 100-300 Å. It is to be noted that the formation of the pad oxidation layer 12 is optional.

The silicon nitride layer 13 is used as a polish stop layer in a subsequent process of performing chemical-mechanical polishing of a trench oxidation layer. However, the present invention is not limited to the silicon nitride of the silicon nitride layer 13 and it is possible to use a material that is polished more slowly than an insulation material that fills a trench. It is preferable that the polish stop layer (i.e., the silicon nitride layer 13) be formed to a thickness of 1000-3000 Å. As an example, the silicon nitride layer 13 may be formed to a thickness of 2000 Å.

The ARC 14 is used to more efficiently enable etching for rounding a silicon nitride layer pattern. The ARC 14 is not limited to any particular material and it is possible to use any conventional ARC made of an organic material.

Following the formation of the ARC 14, a photosensitive layer is deposited thereon, then the photoresist layer is exposed such that a section thereof where a trench is to be formed is removed. A photoresist pattern 15 is formed from this process.

Figure 2B:
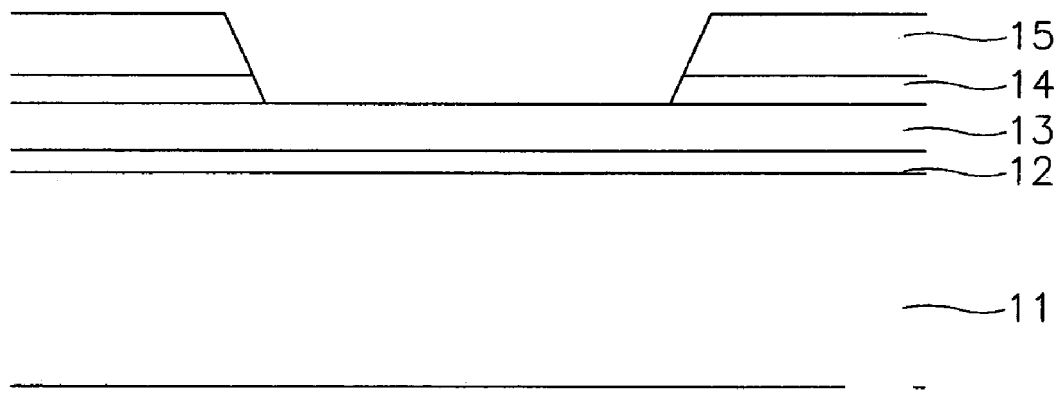

Subsequently, with reference to FIG. 2b, the photoresist pattern is used as a mask to etch an exposed area of the ARC 14.

Figure 2C:
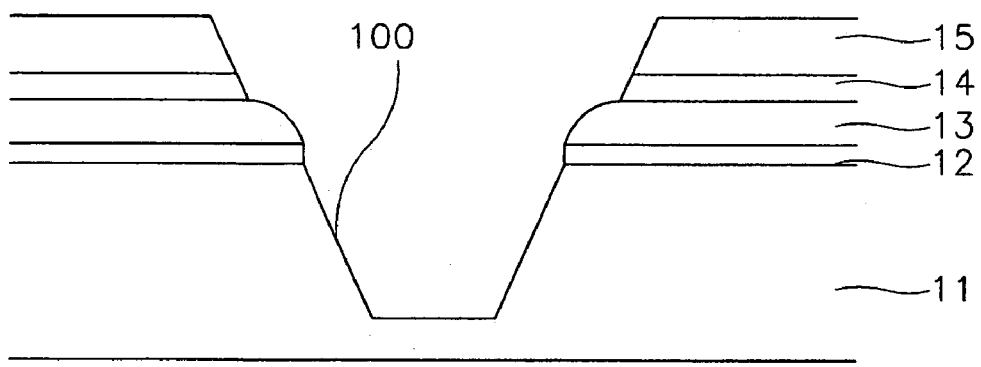

With reference to FIG. 2c, an exposed portion of the silicon nitride film 13, then the pad oxidation layer 12 and a predetermined section of the semiconductor substrate 11 (i.e., a section corresponding to a predetermined depth) under the removed section of the ARC 14 are dry-etched to thereby form a trench 100. Next, the photoresist pattern 15 and the ARC 14 are removed, then a cleaning process is performed.

During dry etching to form the trench 100, etching conditions are controlled such that a small amount of exposed ends of the ARC 14 is removed and upper corners of the silicon nitride layer 13 thereunder are rounded. That is, the amount of the etching gas is varied depending on which type of element or compound is used for the etching gas. For example, to realize this configuration of the ARC 14 and the silicon nitride layer 13, there is used 60 sccm or less of $CHF_3$ gas, 50 sccm or less of $CF_4$ gas, 30 sccm or less of $O_2$ gas, 60 sccm or less of $HeO_2$ gas, or 200 sccm or less of Ar gas.

Further, in a state where the above etching gas is being injected, dry etching is performed with the application of power for creating plasma in the range of 50-500 W, and in a pressurized environment of 5-100 mTorr.

If dry etching is performed under these conditions, a sidewall polymer formed in the initial stages of etching the silicon nitride layer 13 is removed such that the ends of the ARC 14 are etched. As a result, areas of the silicon nitride layer 13 under the ends of the ARC 14 are etched such that the upper corners are rounded. This acts to increase an opening size of the trench 100.

Figure 2D:
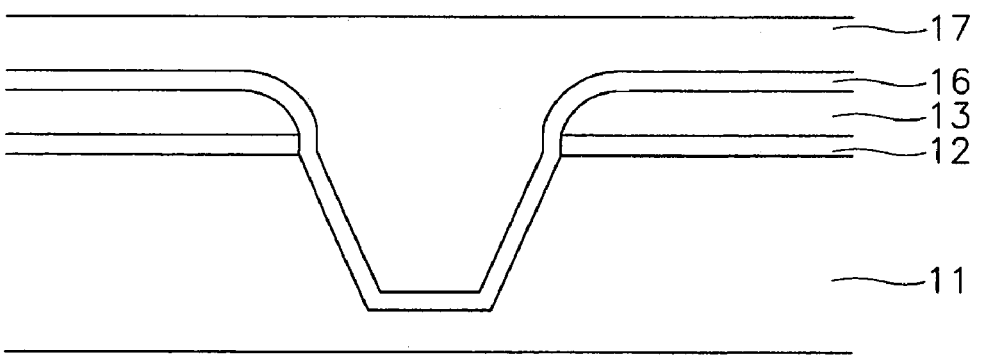
Figure 2E:
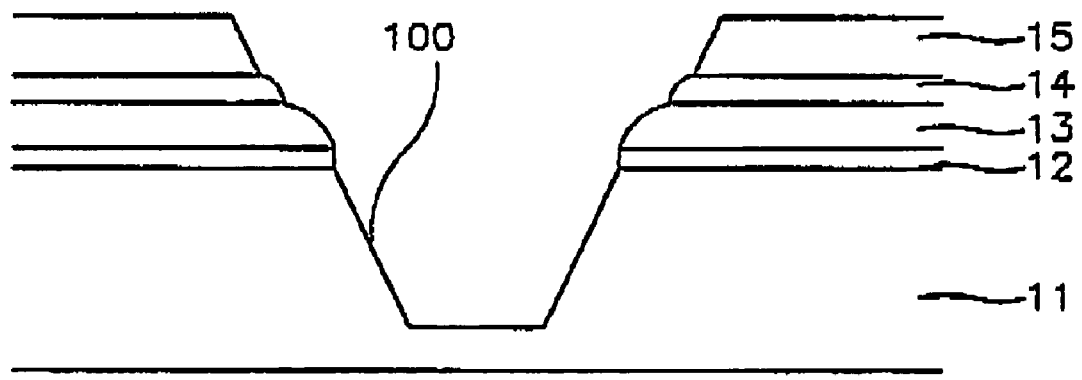

Subsequently, with reference to FIG. 2d, a liner oxidation layer 16 is deposited over all exposed elements including the silicon nitride layer 13, exposed ends of the pad oxidation layer 12, and inner walls of the trench 100 formed by the semiconductor substrate 11. An oxidation layer 17 is then thickly deposited on the liner oxidation layer 16 until sufficiently filling the trench 100.

Since the upper corners of the silicon nitride layer 13 are rounded, the opening of the trench 100 is enlarged to thereby prevent the blocking of the opening before a deep portion of the trench 100 is filled. As a result, the oxidation layer 17 may be formed such that the inside of the trench 100 is completely filled without the formation of a void therein.

Next, chemical-mechanical polishing is performed on the oxidation layer 17 then on the liner oxidation layer 16 thereunder until the silicon nitride layer 13 is exposed. That is, chemical-mechanical polishing is performed until the oxidation layer 17 and the liner oxidation layer 16 that are above the silicon nitride layer 13 are removed such that these elements are flattened and made flush with the silicon nitride layer 13. This completes the shallow trench isolation process.

In the present invention described above, following the formation of the ARC on the silicon nitride layer, etching conditions for the formation of the trench are controlled such that ends of the ARC are etched and the silicon nitride layer thereunder is also etched. As a result, upper corners of the silicon nitride layer are rounded such that the trench oxidation layer may be formed without the formation of a void in the trench. This acts to prevent a reduction in device reliability resulting from current leakage, which occurs with the formation of a void, and also to improve device yield is improved.

Although an embodiment of the present invention has been described in detail hereinabove in connection with certain exemplary embodiments, it should be understood that the invention is not limited to the disclosed exemplary embodiment, but, on the contrary is intended to cover various modifications and/or equivalent arrangements included within the spirit and scope of the present invention, as defined in the appended claims.

What is claimed is:

1. A method of forming a trench in a semiconductor device, comprising:
   forming a polish stop layer on a semiconductor substrate;
   forming an organic anti-reflection coating on the polish stop layer;
   selectively etching the anti-reflection coating to form an anti-reflection coating pattern;
   etching the polish stop layer and the semiconductor substrate such that ends of the polish stop layer adjacent to the trench are rounded along substantially the entire thickness of the polish stop layer, and the trench having sloped sidewalls is formed to a predetermined depth; and
   forming an insulation layer that fills the trench.

2. The method of claim 1, wherein etching the polish stop layer comprises injecting one or more of $CHF_3$, $CF_4$, $O_2$, $HeO_2$, and Ar, creating a plasma and dry etching the polish stop layer.

3. The method of claim 2, wherein etching the polish stop layer comprises injecting at most 60 sccm of $CHF_3$, gas, at most 60 sccm of $CF_4$ gas, at most 30 sccm of $O_2$ gas, at most 60 sccm of $HeO_2$, gas, and at most 200 sccm of Ar gas.

4. The method of claim 2, wherein creating a plasma comprises applying 50-500 W of power while injecting one or more of $CHF_3$, $CF_4$, $O_2$, $HeO_2$, and Ar.

5. The method of claim 2, further comprising creating a pressure environment of 5-100 mTorr during etching the polish stop layer.

6. The method of claim 1, wherein an area of the polish stop layer exposed through the anti-reflection coating pattern is etched, and ends of the anti-reflection coating pattern are also etched such that the ends of the anti-reflection coating are rounded.

7. The method of claim 6, wherein etching the polish stop layer comprises injecting one or more of $CHF_3$, $CF_4$, $O_2$, $HeO_2$, and Ar, creating a plasma and dry etching the polish stop layer.

8. The method of claim 7, wherein etching the polish stop layer comprises injecting at most 60 sccm of $CHF_3$ gas, at most 60 sccm of $CF_4$, gas, at most 30 sccm of $O_2$ gas, at most 60 sccm of $HeO_2$ gas, and at most 200 sccm of Ar gas.

9. The method of claim 7, wherein creating a plasma comprises applying 50-500 W of power while injecting one or more of $CHF_3$, $CF_4$, $O_2$, $HeO_2$, and Ar.

10. The method of claim 8, further comprising creating a pressure environment of 5-100 mTorr during etching the polish stop layer.

11. The method of claim 7, wherein the polish stop layer has a thickness of 1000-3000 Å.

12. The method of claim 1, wherein the polish stop layer comprises a material that is more slowly polished than an insulation material of the insulation layer.

13. The method of claim 12, wherein the polish stop layer comprises a silicon nitride layer having a thickness of 1000-3000 Å.

14. The method of claim 13, wherein etching the polish stop layer comprises injecting one or more of $CHF_3$, $CF_4$, $O_2$, $HeO_2$, and Ar, creating a plasma and dry etching the polish stop layer.

15. The method of claim 14, wherein etching the polish stop layer comprises injecting at most 60 sccm of $CHF_3$, gas, at most 60 sccm of $CF_4$ gas, at most 30 sccm of $O_2$ gas, at most 60 sccm of $HeO_2$, gas, and at most 200 sccm of Ar gas.

16. The method of claim 14, wherein creating a plasma comprises applying 50-500 W of power while injecting one or more of $CHF_3$, $CF_4$, $O_2$, $HeO_2$, and Ar.

17. The method of claim 14, further comprising creating a pressure environment of 5-100 mTorr during etching the polish stop layer.

18. The method of claim 1, wherein forming the insulation layer comprises forming the insulation layer to cover the polish stop layer and inner walls of the trench, and chemical-mechanical polishing the insulation layer until the polish stop layer is exposed.

19. The method of claim 1, wherein prior to forming the insulation layer, the method further comprises forming a liner oxidation layer on the polish stop layer and the trench, and forming the insulation layer comprises depositing an insulation layer material on the liner oxidation layer such that the trench is filled with the insulation layer material.

20. The method of claim 1, further comprising depositing a pad oxidation layer on the semiconductor substrate, wherein the polish stop layer is deposited on the pad oxidation layer.

21. The method of claim 20, wherein etching the polish stop layer and the semiconductor substrate further comprises etching the pad oxidation layer.

22. A method of forming a trench in a semiconductor device, comprising:
   forming a polish stop layer on a semiconductor substrate;
   forming an organic anti-reflection coating on the polish stop layer;
   selectively etching the anti-reflection coating to form an anti-reflection coating pattern;
   etching the polish stop layer and the semiconductor substrate such that upper corners of the polish stop layer adjacent to the trench are rounded along substantially the entire thickness of the polish stop layer, and the trench having sloped sidewalls is formed to a predetermined depth; and
   forming an insulation layer that fills the trench.

* * * * *